(12) United States Patent
Ehara et al.

(10) Patent No.: US 6,424,239 B1
(45) Date of Patent: Jul. 23, 2002

(54) DIFFERENTIAL SURFACE ACOUSTIC WAVE FILTER

(75) Inventors: Hisanori Ehara; Kazushige Noguchi; Yoshikazu Kihara, all of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/580,218

(22) Filed: May 26, 2000

(30) Foreign Application Priority Data

May 28, 1999 (JP) ............................................. 11-149112

(51) Int. Cl.$^7$ ............................. H03H 9/64; H03H 9/68
(52) U.S. Cl. ................................... 333/193; 310/313 R
(58) Field of Search ................................. 333/193, 189, 333/187, 195; 310/313 R

(56) References Cited

U.S. PATENT DOCUMENTS

| | | | | |
|---|---|---|---|---|
| 5,568,002 A | * | 10/1996 | Kawakatsu et al. | 310/313 B |
| 5,892,418 A | * | 4/1999 | Onishi et al. | 333/193 |
| 5,994,980 A | * | 11/1999 | Tada | 333/193 |

FOREIGN PATENT DOCUMENTS

| | | | | |
|---|---|---|---|---|
| JP | 07-288442 | 10/1995 | ............ | H03H/9/64 |
| JP | 09-093079 | 4/1997 | ............ | H03H/9/64 |
| JP | 09/331232 | 12/1997 | ............ | H03H/9/64 |
| JP | 10-107583 | 4/1998 | ............ | H03H/9/64 |
| JP | 10-117123 | 5/1998 | ............ | H03H/9/64 |

OTHER PUBLICATIONS

Hu Shuhao "The Balun Family," Microwave Journal, Sep. 1987, pp. 228–230.

Tajima et al. "A balanced/unbalanced type RF SAW filter having different input/output impedance", The Institute of Electronics, Information and Communication Engineers, A–11–17, Mar. 1997, p. 292.

Taguchi et al. "A New Balanced–Unbalanced Type RF–Band SAW Filter" IEEE MTT–S Digest, Sep. 1996, pp. 417–420.

* cited by examiner

Primary Examiner—Justin P. Bettendorf
Assistant Examiner—Dean Takaoka
(74) Attorney, Agent, or Firm—Venable; Robert J. Frank; Michael A. Sartori

(57) ABSTRACT

In a differential surface acoustic wave resonator, when an unbalanced electric signal is inputted between an input terminal 301 and a[008e] output terminal connected to a ground potential, this electric signal is inputted to two-terminal-pair surface acoustic wave resonators 351 and 352. The electric signal inputted to the two-terminal-pair surface acoustic wave resonator 351 is converted into a surface acoustic wave, and thereafter it is again converted into an electric signal to be outputted to a two-terminal-pair surface acoustic wave resonator 353. The electric signal inputted to the two-terminal-pair surface acoustic wave resonator 353 is converted into a surface acoustic wave, and thereafter it is again converted into an electric signal to be outputted from an output terminal 302 of the differential surface acoustic wave filter as a balanced signal. On the other hand, the electric signal inputted to the two-terminal-pair surface acoustic wave resonator 352 is converted into a surface acoustic wave, and thereafter it is again converted into an electric signal to be outputted to a two-terminal-pair surface acoustic wave resonator 354. The electric signal inputted to the two-terminal-pair surface acoustic wave resonator 354 is converted into a surface acoustic wave, and thereafter it is again converted into an electric signal to be outputted from an output terminal 303 of the differential surface acoustic wave filter as a balanced signal. Here, in the respective two-terminal-pair surface acoustic wave resonators 351 to 354, the phase of the electric signal to be inputted is substantially 180° different from that of the electric signal to be outputted. The balanced signals having the same phase and the same amplitude are outputted from the two output terminals of the differential surface acoustic wave filter.

13 Claims, 8 Drawing Sheets

DIFFERENTIAL SURFACE ACOUSTIC WAVE FILTER

BACKGROUND OF THE INVENTION

1. Field of the Invention

The present invention relates to a differential surface acoustic wave filter, and more particularly to a differential surface acoustic wave filter suitable for use for a high frequency filter built in a mobile communication terminal such as a mobile phone.

This application is a counterpart application of Japanese application Serial Number 149112/1999, filed May 28, 1999, the subject matter of which is incorporated herein by reference.

2. Description of the Related Art

With progression and realization of high frequency of a mobile communication equipment, development of a surface acoustic wave filter (SAW) has been actively carried out. Most of the conventional surface acoustic wave filters is an unbalanced filter. This prior art unbalanced surface acoustic wave filter is provided with two input terminals and two output terminals and is referred to as a two-terminal-pair surface acoustic wave filter. By connecting one of the two input terminals and one of the two output terminals to a ground potential, the unbalanced surface acoustic wave filter processes an unbalanced signal. Further, in a high frequency circuit such as an amplifier built in the mobile communication equipment, use of the balanced signal rather than the unbalanced signal is suitable for improving the operation characteristic of the high frequency circuit itself, and hence a differential amplification type balanced circuit is often used. Therefore, a balanced/unbalanced conversion circuit, i.e., a balun circuit (balanced/unbalanced) is required between the output terminals of the unbalanced surface acoustic wave filter and the input terminals of the amplifier.

As a prior art balun circuit, there is, for example, one disclosed in "The balun Family: MICROWAVE JOURNAL, September 1987; Hu Shuhao" (reference 1). The balun circuit disclosed in this reference 1 is constituted by a passive device such as an inductor or a capacitor, a strip line, and others and extensively put into practical use. That is, the balun circuit, as well as the filter, is an important component in the communication equipment, and made into various shapes and used in accordance with the respective frequency bands such as a VHF (Very High Frequency) band, a UHF (Ultra High Frequency) band, an EHF (Extremely High frequency) band, a milli-meter wave band and others. Recently, as the reduction in size, price and weight of the mobile communication terminal such as a mobile phone advances, downsizing and improvement in the characteristic of the balun circuit are demanded.

On the other hand, as a conventional surface acoustic wave filter, there are such filters disclosed in "A balanced-unbalanced input/output RF-band SAW filter having different input/output impedances; The Institute of Electronics, Information and Communication Engineers, A-11-17, March 1997" (reference 2), "Japanese patent application laid-open No. 331232-1997" (reference 3), "A New Balanced-Unbalanced Type RF-Band SAW Filter; IEEE MTT-S Digest, September, 1996 (Y. Taguchi, S. Seki, K. Eda)" (reference 4). With the demand for downsizing or improvement in the characteristic of the balun circuit, reduction in size and improvement in the characteristic of the surface acoustic wave filter are recently requested. Consequently, there is advanced development of a differential surface acoustic wave filter having both the balanced-unbalanced conversion function and the filter function such as the surface acoustic wave filters disclosed in the above-described references 2 to 4.

Here, FIG. 1 shows the structure of a prior art differential surface acoustic wave filter having both the balanced-unbalanced conversion function and the filter function. As shown in FIG. 1, the conventional differential surface acoustic filter 100 is constituted by three interdigital transducers (which will be referred to as IDTs hereinafter) 108, 110 and 112 and two reflectors 114 and 116. One electrode of the input IDT 108 is connected to an input electrode 102 of the differential surface acoustic wave filter 100 to which an unbalanced signal is inputted, and the other electrode of the input IDT is connected to a ground potential. One electrode of each of the output IDTs 110 and 112 is connected to an output terminal 104 of the differential surface acoustic wave filter 100 from which a balanced signal is outputted, and the other electrode of each of the output IDTs 110 and 112 is connected to an output terminal of the differential surface acoustic wave filter 100 from which the balanced signal is outputted. A number of interdigital electrodes of the IDTs 108, 110 and 112 connected to the input terminal 102 and the output terminal 104 is larger than a number of interdigital electrodes of the opposed IDTs 108, 110 and 112. In other words, the input IDT 108 and the output IDTs 110 and 112 are so formed as to face the same direction.

With the above-described arrangement, the differential surface acoustic wave filter 100 which receives the unbalanced signal and outputs the balanced signal is realized. Assuming that a traveling direction of the surface acoustic wave on a piezoelectric substrate is an X axis; a direction parallel to a crystal plane of a monocrystal $LiNbO_3$ and vertical to the X axis, a Y axis; and a normal line direction of the crystal plane of a monocrystal $LiNbO_3$, a Z axis, when the differential acoustic wave filter 100 is formed on the piezoelectric substrate produced by being cut on the plane inclined at 64° from the Y axis to the Z axis, the insertion loss of 3 dB and attenuation of 30 dB are obtained as the characteristics of the differential surface acoustic wave filter 100.

As to the above-described balun circuit made up of an inductor, a capacitor and others, realization of downsizing and reduction in the insertion loss are demanded. Additionally, reduction in the insertion loss and increase in the attenuation in a frequency band other than a pass frequency band are desired for the above-described differential surface acoustic wave filter.

SUMMARY OF THE INVENTION

It is an object of the present invention to provide a differential surface acoustic wave filter having both an excellent balanced-unbalanced conversion function and a good characteristic without increasing a circuit scale more than necessary.

To achieve this aim, a differential surface acoustic wave filter according to the present invention comprises: a first two-terminal-pair surface acoustic wave resonator having first and second input terminals and first and second output terminals, the first input terminal and the second output terminal being connected to a ground potential; a second two-terminal-pair surface acoustic wave resonator having third and fourth input terminals and third and fourth output terminals, the third input terminal and the fourth output terminals being connected to the ground potential; a fifth input terminal connected to the second and third input terminals, to which an unbalanced signal is inputted; a fifth output terminal connected to the first output terminal of the first surface acoustic wave resonator, from which a first balanced signal having a phase opposite from that of the unbalanced signal is outputted; and a sixth output terminal connected to the fourth output terminal of the second surface acoustic wave resonator, from which a second balanced signal having a phase opposite from that of the unbalanced signal is outputted.

In order to attain this aim, a differential surface acoustic wave filter according to the present invention comprises; a first two-terminal-pair surface acoustic wave resonator having first and second input terminals and first and second output terminals, the first input terminal and the second output terminal being connected to a ground potential; a second two-terminal-pair surface acoustic wave resonator having third and fourth input terminals and third and fourth output terminals, the third input terminal and the fourth output terminal being connected to the ground potential; a third two-terminal-pair surface acoustic wave resonator having fifth and sixth input terminals and fifth and sixth output terminals, the fifth input terminal being connected to the first output terminal, the sixth input terminal being connected to the second output terminal; a fourth two-terminal-pair surface acoustic wave resonator having seventh and eighth input terminals and seventh and eighth output terminals, the seventh input terminal being connected to the third output terminal, the eighth input terminal being connected to the fourth output terminal; a ninth input terminal connected to the second input terminal in the first two-terminal-pair surface acoustic wave resonator and the third input terminal in the second two-terminal-pair surface acoustic wave resonator, to which an unbalanced signal is inputted; a ninth output terminal connected to the fifth output terminal in the third two-terminal-pair surface acoustic wave resonator, from which a first balanced signal having a phase opposite from that of the unbalanced signal is outputted; and a tenth output terminal connected to the eighth output terminal in the fourth two-terminal-pair surface acoustic wave resonator, from which a second balanced signal having a phase opposite from that of the unbalanced signal is outputted, wherein the sixth output terminal in the third two-terminal-pair surface acoustic wave resonator is connected to the seventh output terminal in the fourth two-terminal-pair surface acoustic wave resonator.

DETAILED DESCRIPTION OF THE INVENTION

The preferred embodiments according to the present invention will now be described with reference to the accompanying drawings.

Figure 1:
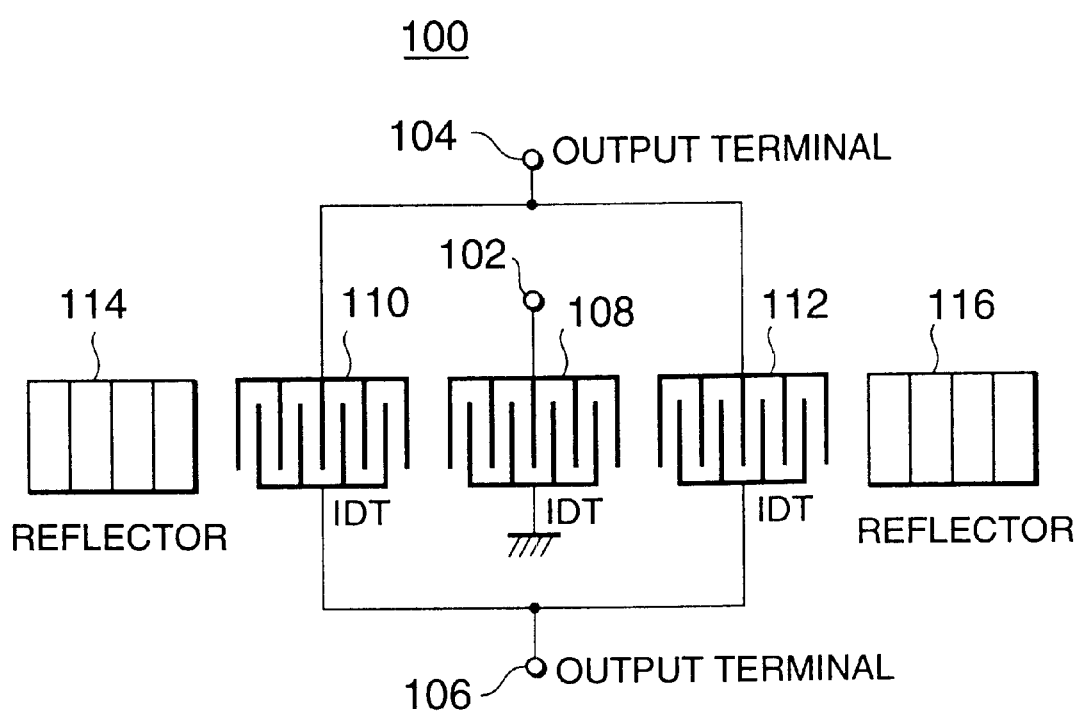
FIG. 1 is a view showing the structure of a prior art differential surface acoustic wave filter.
Figure 2:
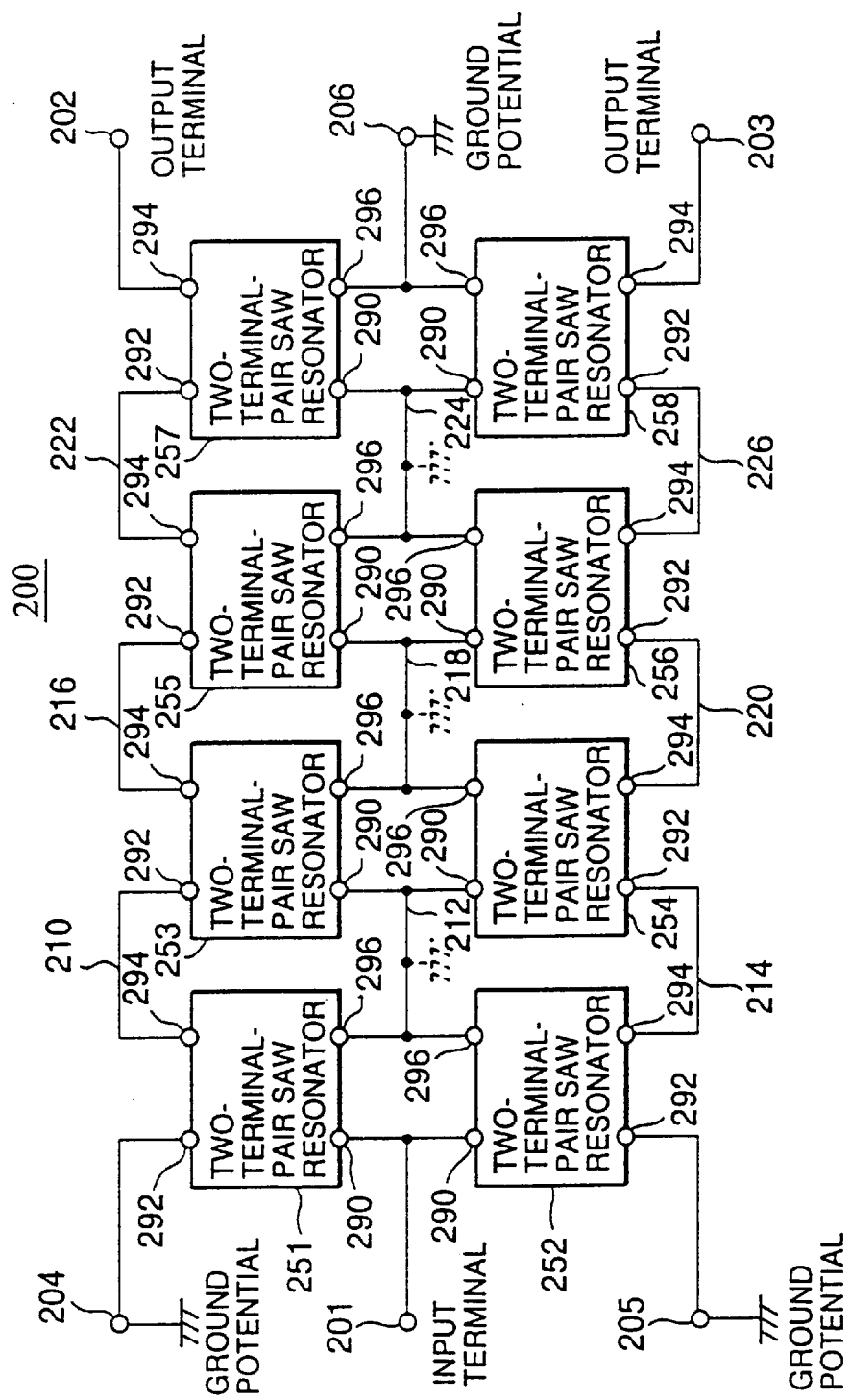
FIG. 2 is a view of the structure of a differential surface acoustic wave filter for illustrating the principle of the present invention.
Figure 3:
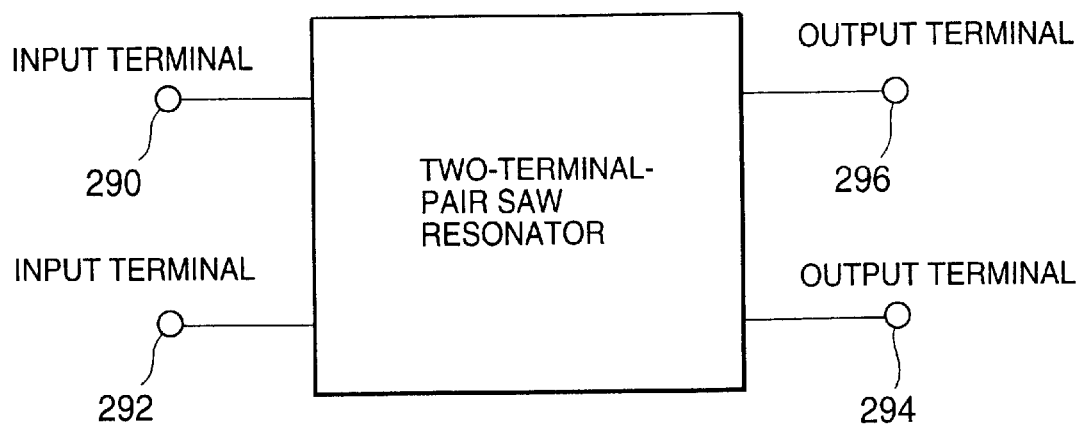
FIG. 3 is a view showing the concept of a two-terminal-pair surface acoustic wave circuit in the present invention.

FIG. 2 is a view showing the structure of a differential surface acoustic wave filter (which will be referred to as a differential SAW filter hereinafter) for illustrating the principle of the present invention. As shown in FIG. 2, the differential SAW filter 200 is constituted by two-terminal-pair surface acoustic wave circuits (which will be referred to as two-terminal-pair SAW circuits hereinafter) 251 to 258. FIG. 3 shows the concept of each two-terminal-pair surface acoustic wave circuit used in FIG. 2. As shown in FIG. 3, the two-terminal-pair SAW circuit has two input terminals 290 and 292 and two output terminals 294 and 296. In this case, the input terminal 292 and the output terminal 296 are connected to, e.g., a ground potential. When a positive phase signal is inputted to the input terminal 290, a negative phase signal opposite from the position phase signal is outputted from the output terminal 294. It is to be noted that description has been give as the case where the positive phase signal is inputted to the input terminals 290 and 292 and the negative phase signal is outputted from the output terminals 294 and 296, but the input terminals 209 and 292 may be determined as output terminals from which the negative phase signal is outputted and the output terminals 294 and 296 may be determined as input terminals to which the positive phase signal is inputted.

Referring to FIG. 2, description will be first given on the circuit structure at a first stage of the differential SAW filter 200. The first stage, circuit is constituted by a pair of two-terminal-pair SAW circuits 251 and 252 arranged in the back-to-back manner. Each input terminal 290 in the two-terminal-pair SAW circuits 251 and 252 is connected to an input terminal 201 of the differential SAW filter 200 to which an unbalanced signal is inputted. The other input terminal 292 of the two-terminal-pair SAW circuit 251 is connected to a ground terminal 204 of the differential SAW filter 200, and the other input terminal 292 of the two-terminal-pair SAW circuit 252 is connected to a ground terminal 205 of the differential SAW filter 200. An output terminal 296 in the two-terminal-pair SAW circuit 251 is connected to an output terminal 296 in the two-terminal-pair SAW circuit 252 through a connection line 212.

The circuit structure of a second stage of the differential SAW filter 200 will now be described. This second stage is constituted by a pair of two-terminal-pair SAW circuits 253 and 254 arranged in the back-to-back manner. Each input terminal 290 in the two-terminal-pair SAW circuits 253 and 254 is connected to a connection line 212. An input terminal 292 in the two-terminal-pair SAW circuit 253 is connected to an output terminal 294 of the two-terminal-pair SAW circuit 251 through a connection line 210, while an input terminal 292 in the two-terminal-pair SAW circuit 254 is connected to an output terminal 294 of the two-terminal-pair SAW circuit 252 through a connection line 214. An output terminal 296 in the two-terminal-pair SAW circuit 253 is connected to an output terminal 296 in the two-terminal-pair SAW circuit 254 through a connection line 218.

The circuit structure of a third stage of the differential SAW filter 200 will now be described. The circuit at the third stage is constituted by a pair of two-terminal-pair SAW circuits 255 and 256 arranged in the back-to-back manner. Each input terminal 290 in the two-terminal-pair SAW circuits 255 and 256 is connected to a connection line 218.

An input terminal 292 in the two-terminal-pair SAW circuit 255 is connected to an output terminal 294 in the two-terminal-pair SAW circuit 253 through a connection line 216, while an input terminal 292 in the two-terminal-pair SAW circuit 256 is connected to an output terminal 294 of the two-terminal-pair SAW circuit 254 through a connection line 220. An output terminal 296 in the two-terminal-pair SAW circuit 255 is connected to an output terminal 296 in the two-terminal-pair SAW circuit 256 via a connection line 224.

At last, description will now be given as to the circuit structure of a fourth stage of the differential SAW filter 200. The circuit of the fourth stage is constituted by a pair of two-terminal-pair SAW circuits 257 and 258 arranged in the back-to-back manner. Each input terminal 290 in the two-terminal-pair SAW circuits 257 and 258 is connected to a connection line 224. An input terminal 292 in the two-terminal-pair SAW circuit 257 is connected to an output terminal 294 of the two-terminal-pair SAW circuit 255 via a connection line 222, while an input terminal 292 in the two-terminal-pair SAW circuit 258 is connected to an output terminal 294 of the two-terminal-pair SAW circuit 256 through a connection line 226. Each output terminal 296 in the two-terminal-pair SAW circuits 257 and 258 is connected to a ground terminal 206 of the differential SAW filter 200. An output terminal 294 of the two-terminal-pair SAW circuit 257 is connected to an output terminal 202, from which a balanced signal is outputted, in the differential SAW filter 200, while an output terminal 294 of the two-terminal-pair SAW circuit 258 is connected to an output terminal 203, from which a balanced signal is outputted, in the differential SAW filter 200. The above-described connection lines 212, 218 and 224 may be connected to the ground potential.

The operation of the differential SAW filter 200 having the above-described structure, representing the principle of the present invention, will now be described.

At first, upon input of an unbalanced electric signal (positive phase signal) to the input terminal 201 of the differential SAW filter 200, this unbalanced electric signal is applied to the two-terminal-pair SAW circuits 251 and 252 in the initial stage. After the electric signal inputted to the two-terminal-pair SAW circuits 251 and 252 is converted into a surface acoustic wave in the two-terminal-pair SAW circuits 251 and 252, it is again converted into an electric signal and outputted to the two-terminal-pair SAW circuits 253 and 254 in the second stage through the connection lines 210 and 214. At this time, each electric signal outputted from the two-terminal-pair SAW circuits 251 and 252 has a phase which is substantially 180° different from that of the electric signal inputted to the two-terminal-pair SAW circuits 251 and 252. That is, when the positive phase signal is inputted to the two-terminal-pair SAW circuits 251 and 252, the negative phase signal is outputted from the two-terminal-pair SAW circuits 251 and 252. Further, the negative phase signal outputted from the two-terminal-pair SAW circuit 251 and the negative phase signal outputted from the two-terminal-pair SAW circuit 252 have substantially equal phase and amplitude.

After the negative phase electric signals inputted to the two-terminal-pair SAW circuits 253 and 254 in the second stage are converted into the respective surface acoustic waves in the two-terminal-pair SAW circuits 253 and 254, they are again converted into electric signals and outputted to the two-terminal-pair SAW circuits 255 and 256 in the third stage through the connection lines 216 and 220. At this time, each electric signal outputted from the two-terminal-pair SAW circuits 253 and 254 has a phase which is substantially 180° different from that of the electric signal inputted to the two-terminal-pair SAW circuits 253 and 254. Therefore, each electric signal outputted from the two-terminal-pair SAW circuits 253 and 254 is an electric signal (positive phase signal) having the phase which is substantially the same as that of the unbalanced electric signal inputted to the input terminal of the differential SAW filter 200. Further, the positive phase signal outputted from the two-terminal-pair SAW circuit 253 and the positive phase signal outputted from the two-terminal-pair SAW circuit 254 have the substantially equal phase and the amplitude.

After the positive phase electric signals inputted to the two-terminal-pair SAW circuits 255 and 256 in the third stage are converted into surface acoustic waves in the two-terminal-pair SAW circuits 255 and 256, they are again converted into electric signals and outputted to the two-terminal-pair SAW circuits 257 and 258 at the fourth stage through the connection lines 222 and 226. Here, each electric signal outputted from the two-terminal-pair SAW circuits 255 and 256 has a phase which is substantially 180° different from that of the electric signal inputted to the two-terminal-pair SAW circuits 255 and 256. Therefore, each electric signal outputted from the two-terminal-pair SAW circuits 255 and 256 is a negative phase electric signal opposite from the unbalanced electric signal inputted to the input terminal of the differential SAW filter 200. Additionally, the negative phase signal outputted from the two-terminal-pair SAW circuit 255 and the negative phase signal outputted from the two-terminal-pair SAW circuit 256 have the substantially equal phase and amplitude.

After the negative phase electric signals inputted to the two-terminal-pair SAW circuits 257 and 258 in the fourth stage are converted into surface acoustic waves in the two-terminal-pair SAW circuits 257 and 258, they are again converted into the electric signals and outputted from the output terminals 202 and 203 of the differential SAW filter 200 as the balanced signals. Here, each electric signal outputted from the two-terminal-pair SAW circuits 257 and 258 has a phase which is substantially 180° different from that of each electric signal inputted to the two-terminal-pair SAW circuits 257 and 258. Therefore, each electric signal outputted from the two-terminal-pair SAW circuits 257 and 258 is an electric signal (positive phase signal) having the phase which is substantially the same as that of the balanced electric signal inputted to the input terminal of the differential SAW filter 200. Moreover, the positive phase signal outputted from the two-terminal-pair SAW circuit 257 and the positive phase signal outputted from the two-terminal-pair SAW circuit 258 have the substantially equal phase and amplitude.

As described above, in the differential SAW filter 200 shown in FIG. 2, electric signals (negative phase signals) each of which has a phase substantially 180° different from that of the unbalanced signal applied to the input terminal 201 of the differential SAW filter 200 are outputted from the two-terminal-pair SAW circuits 251, 252, 255 and 256 in the odd-numbered stage. On the other hand, the two-terminal-pair SAW circuits 253, 254, 257 and 258 in the even-numbered stage output electric signals (positive phase signals) each of which has a phase substantially equal to that of the unbalanced electric signal supplied to the input terminal 201 of the differential SAW filter 200.

Incidentally, although the differential SAW filter 200 shown in FIG. 2 has a structure in which the two-terminal-pair SAW circuits arranged and connected in the back-to-back manner are connected in four stages, the differential SAW filter in the present invention is characterized by including the two-terminal-pair SAW circuits arranged and connected in the back-to-back manner, and a number of stages of the two-terminal-pair SAW circuit may be one or more.

Figure 4:
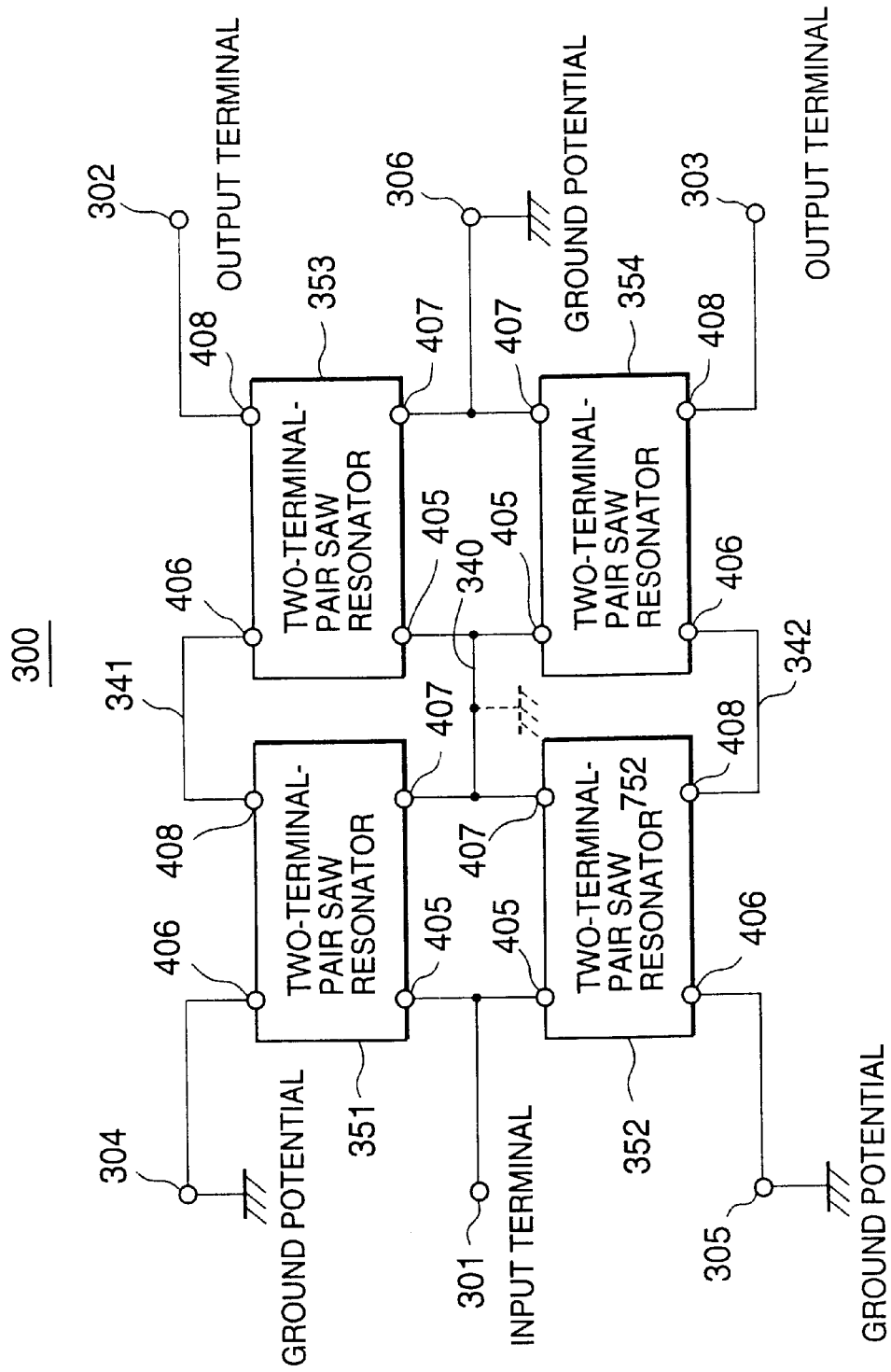
FIG. 4 is a view showing the structure of a differential surface acoustic wave filter according to a first embodiment of the present invention.

A differential SAW filter 300 according to the first embodiment of the present invention, which utilizes the above-described principle, will now be described with reference to FIGS. 4 and 5. As shown in FIG. 4, the differential SAW filter 300 can be realized by forming two-terminal-pair SAW resonators 351 to 354 on a piezoelectric substrate consisting of, e.g., lithium niobate (LiNbO$_3$) and the like. The differential SAW filter 300 according to the first embodiment has such a structure as that the two-terminal-pair SAW resonators arranged and connected in the back-to-back manner are connected in two stages. In the differential SAW filter 300, the circuit in the initial stage is constituted by the two-terminal-pair SAW resonators 351 and 352, and the circuit in the second stage is constituted by the two-terminal-pair SAW resonators 353 and 354.

Figure 5:
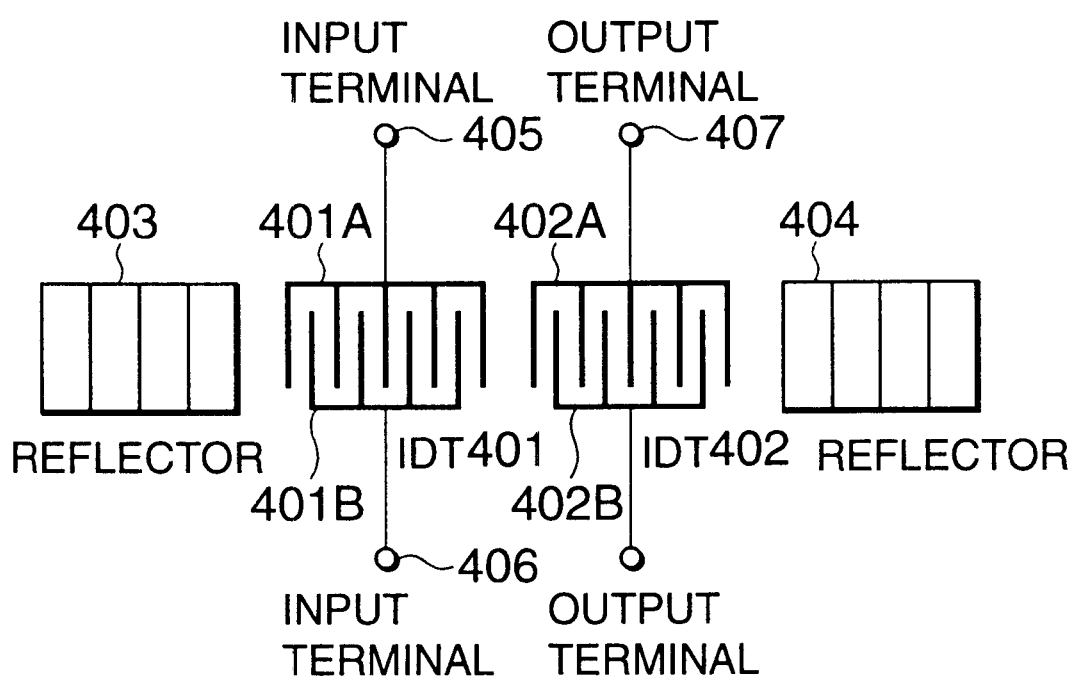
FIG. 5 is a view showing the structure of a two-terminal-pair surface acoustic wave resonator according to the first or third embodiment of the present invention.

Each of the two-terminal-pair SAW resonators 351 to 354 shown in FIG. 4 is made up of two IDTs 401 and 402 and two reflectors 403 and 404 as illustrated in FIG. 5. The reflectors 403 and 404 are disposed on the both sides of the two IDTs 401 and 402. The IDT 401 is formed by interdigital electrodes 401A and 401B, while the IDT 402 is constituted by interdigital electrodes 402A and 402B. On the other hand, each of the two-terminal-pair SAW resonators 351 to 354 has four terminals (input terminals 405 and 406 and output terminals 407 and 408). The interdigital electrode 401A is connected to the input terminal 405; the interdigital electrode 401B, the input terminal 406; the interdigital electrode 402A, the input terminal 407; and the interdigital electrode 402B, the input terminal 408. Additionally, a number of poles of the interdigital electrode 401A is greater than that of the interdigital electrode 401B in the IDT 401, and a number of poles of the interdigital electrode 402B is larger than that of the interdigital electrode 402A in the IDT 402. That is, the shape of the IDT 401 is opposed to that of the IDT 402.

Description will not be given on the relationship of connection between the respective two-terminal-pair SAW resonators 351 to 354 when the differential SAW filter 300 is constituted by using the respective two-terminal-pair resonators 351 to 354 having the above-described structure with reference to FIG. 4.

The circuit structure of the first stage in the differential SAW filter 300 will now be described. One input terminal 405 in each of the two-terminal-pair SAW resonators 351 and 352 is connected to the input terminal 301 to which the unbalanced electric signal of the differential SAW filter 300 is inputted. The other input terminal 406 in each of the two-terminal-pair SAW resonators 351 and 352 is connected to the ground potential through the ground terminals 304 and 305 of the differential SAW filter 300. The output terminal 407 of the two-terminal-pair SAW resonator 351 is connected to the output terminal 407 of the two-terminal-pair SAW resonator 352 via the connection line 340.

Next, the two-terminal-pair SAW resonators 353 and 354 at the second stage which are connected to the above-described two-terminal-pair SAW resonators 351 and 352 through the connection lines 340 to 342 will be described hereunder. The two-terminal-pair SAW resonators 353 and 354 on the output side of the differential SAW filter 300 for outputting the balanced signal are arranged and connected in the back-to-back fashion. The both input terminals 405 of the two-terminal-pair SAW resonators 353 and 354 are connected to the connection line 340. That is, each output terminal 407 of the two-terminal-pair resonators 351 and 352 is connected to each input terminal 405 of the two-terminal-pair SAW resonators 353 and 354 through the connection line 340. The input terminal 406 of the two-terminal-pair SAW resonator 353 is connected to the output terminal 408 of the two-terminal-pair SAW resonator 351 via the connection line 341, and the input terminal 406 of the two-terminal-pair SAW resonator 354 is connected to the output terminal 408 of the two-terminal-pair SAW resonator 352 through the connection line 342. The both output terminals 407 of the two-terminal-pair SAW resonators 353 and 354 are connected to the ground potential through the ground terminal 306 of the differential SAW filter 300. The output terminal 408 of the two-terminal-pair SAW resonator 353 is connected to the output terminal 302 of the differential SAW filter 300 from which the balanced electric signal is outputted, and the output terminal 408 of the two-terminal-pair SAW resonator 354 is connected to the output terminal 300 of the differential SAW filter 300 from which the balanced electric signal is outputted. It is to be noted that the connection line 340 may be connected to the ground potential.

The following describes the operation of the differential SAW filter 300 having the above-mentioned structure according to the first embodiment of the present invention.

Firstly, after the unbalanced electric signal (positive phase signal) is inputted to the input terminal 301 of the differential SAW filter 300, the unbalanced electric signal is inputted to each of the two-terminal-pair SAW resonator 351 and 352 in the initial stage. After the electric signal applied to each of the two-terminal-pair SAW resonators 351 and 352 is converted into the surface acoustic wave in the two-terminal-pair resonators 351 and 352, it is again converted into an electric signal and outputted to each of the two-terminal-pair SAW resonators 353 and 354 in the second stage through the connection lines 341 and 342. Here, each electric signal outputted from the two-terminal-pair SAW resonators 351 and 352 has a phase which is substantially 180° different from that of the electric signal inputted to each of the two-terminal-pair SAW resonators 351 and 352. That is, when the positive phase signals are inputted to the two-terminal-pair SAW resonators 351 and 352, the negative phase signals are outputted from the two-terminal-pair SAW circuits 351 and 352. Further, the negative phase signal outputted from the two-terminal-pair SAW resonator 351 and the negative phase signal outputted from the two-terminal-pair SAW resonator 352 have the substantially equal phase and amplitude.

After the negative phase electric signal inputted to each of the two-terminal-pair SAW resonators 353 and 354 in the second stage is converted into the surface acoustic wave in the two-terminal-pair resonators 353 and 354, it is again converted into an electric signal and outputted as a balanced signal from each of the output terminals 302 and 303 of the differential SAW filter 300. In this example, each electric signal outputted from the two-terminal-pair SAW resonators 353 and 354 has a phase which is substantially 1800 different from that of the electric signal (negative phase signal) inputted to each of the two-terminal-pair SAW resonators 353 and 354. The electric signal outputted from each of the two-terminal-pair SAW resonators 353 and 354 is, therefore, an electric signal (positive phase signal) having a phase which is substantially equal to that of the unbalanced electric signal applied to the input terminal 301 of the differential SAW filter 300. Furthermore, the balanced positive phase signal outputted from the two-terminal-pair SAW resonator 353 and the balanced positive phase signal outputted from the two-terminal-pair SAW resonator 354 have the substantially equal phase and amplitude.

As described above, since the differential SAW filter according to the first embodiment of the present invention is constituted such that the two balanced signals outputted from the differential SAW filter are respectively outputted from a pair of two-terminal-pair SAW resonators arranged and connected in the back-to-back manner, the insertion loss in the pass frequency band can be suppressed while increasing the attenuation in a frequency band other than the pass frequency band. Thus, it is possible to realize the differential SAW filter having the excellent balanced-unbalanced conversion function and the good filter characteristic. In addition, the balanced signals whose phases and amplitude are substantially the same can be supplied to the high frequency amplification circuit which is connected to the differential SAW filter and processes the balanced signals.

Figure 6:
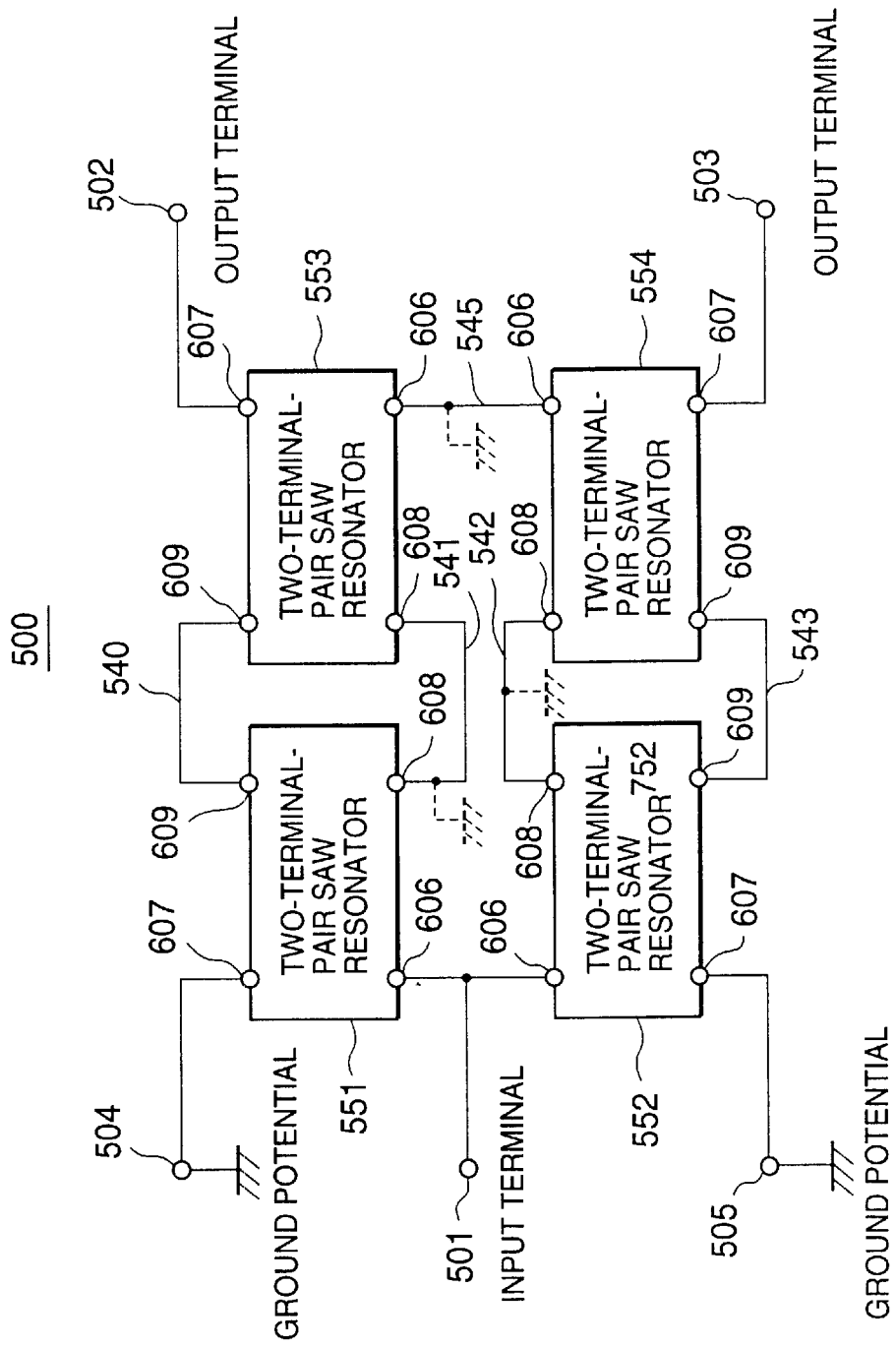
FIG. 6 is a view showing the structure of a differential surface acoustic wave filter according to a second embodiment of the present invention.

A differential SAW filter according to a second embodiment of the present invention will now be described with reference to FIGS. 6 and 7. As depicted in FIG. 6, the differential SAW filter 500 can be realized by forming two-terminal-pair SAW resonators 551 to 554 on a piezoelectric substrate consisting of, for example, lithium niobate (LiNbO$_3$) and the like. The differential SAW filter 500 according to the second embodiment has such a structure as that the two-terminal-pair SAW resonators arranged and connected in the back-to-back manner are connected in two stages. In the differential SAW filter 500, the circuit in the initial stage is constituted by the two-terminal-pair SAW resonators 551 and 552 and the circuit in the second stage is formed by the two-terminal-pair SAW resonators 553 and 554.

Figure 7:
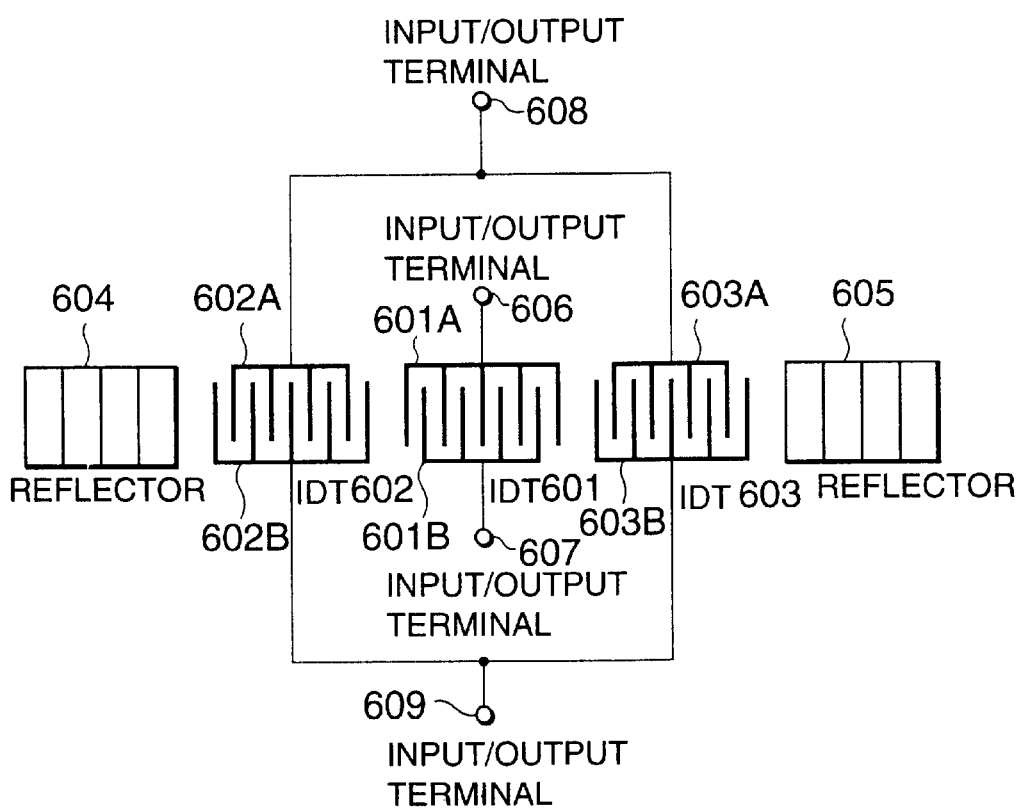
FIG. 7 is a view showing the structure of a two-terminal-pair surface acoustic wave resonator according to the second embodiment of the present invention.

As shown in FIG. 7, each of the two-terminal-pair resonators 551 to 554 illustrated in FIG. 6 is made up of three IDTs 601 to 603 and two reflectors 604 to 605. The reflectors 604 and 605 are disposed on the both sides of the three IDTs 601 to 603. The IDT 601 is constituted by the interdigital electrodes 601A and 601B; the IDT 602, the interdigital electrodes 602A and 602B; and the IDT 603, the interdigital electrodes 603A and 603B. Meanwhile, each of the two-terminal-pair SAW resonators 551 to 554 has four terminals (input/output terminals 606 to 609). The interdigital electrode 601A is connected to the input/output terminal 606; the interdigital electrode 601B, the input/output terminal, 607; the interdigital electrodes 602A and 603A, the input/output terminal 608; and the interdigital electrodes 602B and 603B, the input/output terminal 609. A number of poles of the interdigital electrode 601A is greater than a number of poles of the interdigital electrode 601B in the IDT 601; a number of poles of the interdigital electrode 602B is greater than a number of poles of the interdigital electrode 602A in the IDT 602; and a number of poles of the interdigital electrode 603B is larger than a number of poles of the interdigital electrode 603A in the IDT 603. That is, the shape of the IDT is opposed to those of the IDTs 602 and 603.

When the two-terminal-pair SAW resonator having the above-described input/output terminals 606 to 609 is used in the circuit at the initial stage to which the unbalanced electric signal is inputted, the input/output terminal 606 functions as the input terminal 606 to which the unbalanced electric signal is inputted; the input/output terminal 607, the input terminal 607 connected to the ground potential; and the input/output terminals 608 and 609, the output terminals 608 and 609 outputting electric signals to the two-terminal-pair SAW resonator in the next stage. On the other hand, when the two-terminal-pair resonator having the above-mentioned input/output terminals 606 to 609 is used in the circuit at the final stage from which the balanced electric signal is outputted, the input/output terminal 606 serves as the output terminal 606 connected to the ground potential; the input/output terminal 607, the output terminal 607 from which the balanced electric signal is outputted; and the input/output terminals 608 and 609, the input terminals 608 and 609 to which the electric signals are inputted from the two-terminal-pair SAW resonator at the previous stage.

Description will now be given as to the connection relationship between the respective two-terminal-pair SAW resonators 551 to 554 in cases where the respective two-terminal-pair SAW resonators are used to configure the differential SAW filter 500 with reference to FIG. 6.

The circuit structure at the initial stage in the differential SAW filter 500 will be first explained. The two-terminal-pair SAW resonators 551 and 552 are arranged and connected in the back-to-back manner. One input terminal 606 in each of the two-terminal-pair SAW resonators 551 and 552 is connected to the input terminal 501, to which the unbalanced electric signal is inputted, of the differential SAW filter 500. The other input terminal 607 in each of the two-terminal-pair SAW resonators 551 and 552 is connected to the ground potential through the ground terminals 504 and 505 of the differential SAW filter 500. The output terminal 609 of the two-terminal-pair SAW resonator 551 is connected to the input terminal 609 of the two-terminal-pair resonator 553 in the second stage via the connection line 540. The output terminal 608 of the two-terminal-pair SAW resonator 551 is connected to the input terminal 608 of the two-terminal-pair SAW resonator 553 in the second stage through the connection line 541. The output terminal 609 of the two-terminal-pair SAW resonator 552 is connected to the input terminal 609 of the two-terminal-pair SAW resonator 554 in the second stage through the connection line 543. The output terminal 608 of the two-terminal-pair SAW resonator 552 is connected to the input terminal 608 of the two-terminal-pair SAW resonator 554 in the second stage through the connection line 542.

The following describes the two-terminal-pair SAW resonators 553 and 554 at the second stage connected to the above-described two-terminal-pair SAW resonators 551 and 552 at the first stage via the connection lines 540 and 543. The two-terminal-pair SAW resonators 553 and 554 on the output side of the differential SAW filter 500 for outputting the balanced signal are arranged and connected in the back-to-back manner. The output terminal 606 of the two-terminal-pair SAW resonator 553 is connected to the output terminal 606 of the two-terminal-pair SAW resonator 554 via the connection line 545. The output terminal 607 of the two-terminal-pair SAW resonator 553 is connected to the output terminal 502 of the differential SAW filter 500 for outputting the balanced electric signal, and the output terminal 607 of the two-terminal-pair SAW resonator 554 is connected to the output terminal 503 of the differential SAW filter 500 for outputting the balanced electric signal. It is to be noted that the connection line 545 may be connected to the ground potential.

The operation of the differential SAW filter 500 having the above-described configuration according to the second embodiment of the present invention will now be described hereunder.

At first, after the unbalanced electric signal (positive phase signal) is inputted to the input terminal 501 of the differential SAW filter 500, the unbalanced electric signals are inputted to the two-terminal-pair SAW resonators 551 and 552 at the initial stage. After the electric signals inputted to the two-terminal-pair SAW resonators 551 and 552 art converted into surface acoustic waves in the two-terminal-pair SAW resonators 551 and 552, they are again converted into electric signals and outputted to the two-terminal-pair SAW resonators 553 and 554 in the second stage through the connection lines 540 and 543. Here, the electric signals outputted from the two-terminal-pair SAW resonators 551 and 552 have a phase which is 180° different from that of the electric signals inputted to the two-terminal-pair SAW resonators 551 and 552. That is, when the positive phase signals are inputted to the two-terminal-pair SAW resonators 551 and 552, the negative phase signals are outputted from the two-terminal-pair SAW circuits 551 and 552. Further, the negative phase signal outputted from the two-terminal-pair SAW resonator 551 and the negative phase signal outputted from the two-terminal-pair SAW resonator 552 have the substantially equal phase and amplitude.

The negative phase electric signals inputted to the two-terminal-pair SAW resonators 553 and 554 at the second stage are converted into the surface acoustic waves in the two-terminal-pair SAW resonators 553 and 554, and thereafter they are again converted into the electric signals to be outputted as the balanced signals from the output terminals 502 and 503 of the differential SAW filter 500. Here, the respective electric signals outputted from the two-terminal-pair SAW resonators 553 and 554 have a phase which is substantially 180° different from that of the electric signals (negative phase signals) inputted to the two-terminal-pair SAW resonators 553 and 554. Therefore, the electric signals outputted from the two-terminal-pair SAW resonators 553 and 554 are the electric signals (positive phase signals) having substantially the same phase as the unbalanced electric signal inputted to the input terminal 501 of the differential SAW filter 500. Further, the balanced positive phase signal outputted from the two-terminal-pair SAW resonator 553 and the balanced positive phase signal outputted from the two-terminal-pair SAW resonator 554 have the substantially equal phase and amplitude.

As described above, the differential SAW filter according to the second embodiment of the present invention is constituted so that the two balanced signals outputted from the differential SAW filter are respectively outputted from a pair of two-terminal-pair SAW resonators arranged and connected in the back-to-back manner, and the respective two-terminal-pair SAW resonators are configured by using the three IDTs, which can further reduce the insertion loss in the pass frequency band and increase the attenuation in a frequency band other than the pass frequency band. It is therefore possible to realize the differential SAW filter having the good balanced-unbalanced conversion function and the excellent filter characteristic. Further, the balanced signals having the substantially equal phase and amplitude can be supplied to the high frequency amplification circuit which is connected to the differential SAW filter and processes the balanced signal.

Figure 8:
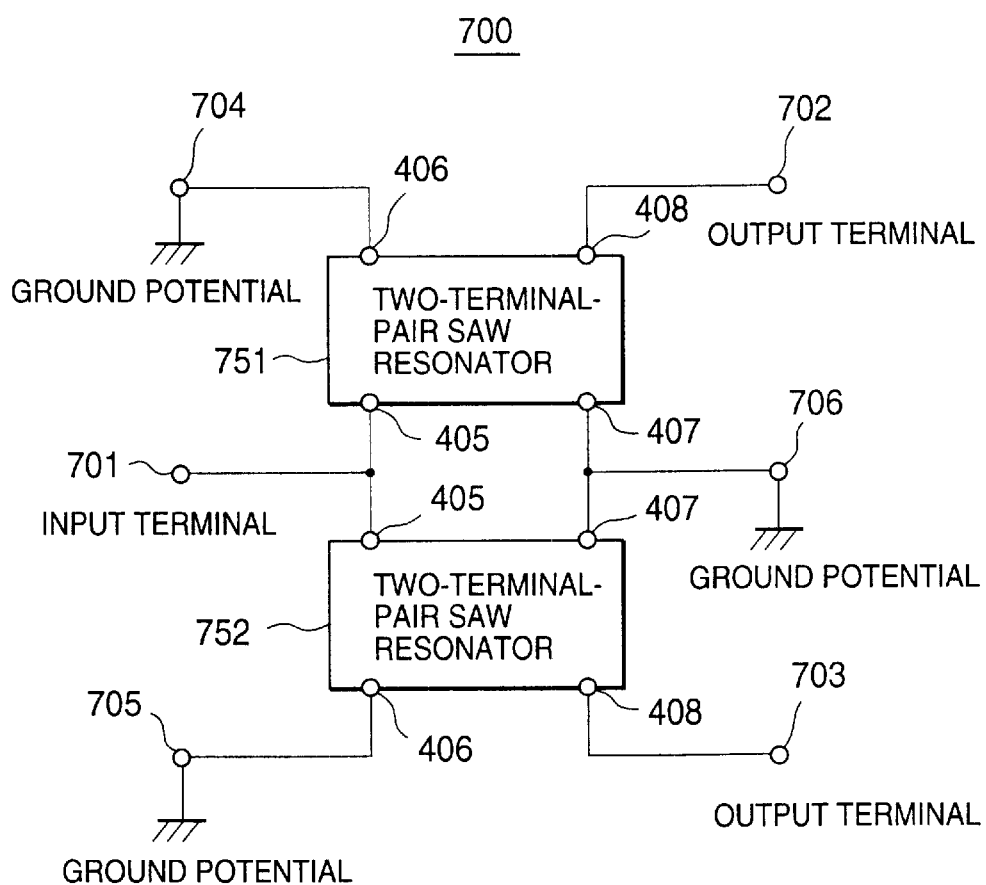
FIG. 8 is a view showing the structure of a differential surface acoustic wave filter according to a third embodiment of the present invention.

A differential SAW filter 700 according to a third embodiment of the present invention will now be described with reference to FIG. 8. As shown in FIG. 8, the differential SAW filter 700 can be realized by forming two-terminal-pair SAW resonators 751 and 752 connected in the back-to-back manner on a piezoelectric substrate consisting of, for example, lithium niobate (LiNbO$_3$) in one stage. Each of these two-terminal-pair SAW resonators 751 and 752 is constituted by two IDTs 401 and 402 and two reflectors 403 and 404 such as shown in FIG. 5. Description will now be given on the connection relationship between the respective two-terminal-pair SAW resonators 751 and 752 in cases where the respective two-terminal-pair SAW resonators 751 and 752 having the above-described configuration are used to from the differerial SAW filter 700 with reference to FIG. 8.

One input terminal 405 in each of the two-terminal-pair SAW resonators 751 and 752 is connected to an input terminal 701 of the differential SAW filter 700 to which the unbalanced electric signal is inputted. The other input terminal 406 in each of the two-terminal-pair SAW resonators 751 and 752 is connected to the ground potential via ground terminals 704 and 705 of the differential SAW filter 700. An output terminal 408 of the two-terminal-pair SAW filter 751 is connected to an output terminal 702 of the differential SAW filter 700 from which the balanced electric signal is outputted, and an output terminal 408 of the two-terminal-pair SAW resonator 752 is connected to an output terminal 703 of the differential SAW filter 700 from which the balanced electric signal is outputted. Each output terminal 407 in each of the two-terminal-pair SAW resonators 751 and 752 is connected to the ground potential through an output terminal 706 of the differential SAW filter 700.

The operation of the differential SAW filter 700 having the above-described structure according to the third embodiment of the present invention will now be described.

After the unbalanced electric signal (positive phase signal) is inputted to the input terminal 701 of the differential SAW filter 700, the unbalanced electric signals are inputted to the two-terminal-pair SAW resonators 751 and 752. The electric signals inputted to the two-terminal-pair SAW resonators 751 and 752 are converted into surface acoustic waves in the two-terminal-pair SAW resonators 751 and 752, and thereafter they are again converted into electric signals to be outputted as the balanced electric signals from the respective output terminals 702 and 703 of the differential SAW filter 700. Here, the electric signals outputted from the two-terminal-pair SAW resonators 751 and 752 have a phase which is substantially 1800 different from that of the electric signals inputted to the two-terminal-pair SAW resonators 751 and 752. That is, when the positive phase signals are inputted to the two-terminal-pair SAW resonators 751 and 752, the negative phase signals are outputted from the two-terminal-pair SAW circuits 751 and 752. Further, the negative phase signal outputted from the two-terminal-pair SAW resonator 751 and the negative phase signal outputted from the two-terminal-pair SAW resonator 752 have the substantially equal phase and amplitude.

As described above, since the differential SAW filter according to the third embodiment of the present invention is constituted in such a manner that the two balanced signals outputted from the differential SAW filter are respectively outputted from a pair of two-terminal-pair SAW resonators arranged and connected in the back-to-back fashion, the insertion loss in the pass frequency band can be decreased and the attenuation in a frequency band other than the pass frequency band can be increased. Therefore, the differential SAW filter having the good balanced-unbalanced conversion function and the excellent filter characteristic can be realized. Further, the balanced signals having the substantially equal phase and amplitude can be supplied to the high frequency amplification circuit which is connected to the differential SAW filter and processes the balanced signals.

What is claimed is:

1. A differential surface acoustic wave filter comprising:
   a first two-terminal-pair surface acoustic wave resonator having first and second input terminals and first and second output terminals, said first input terminal and said second output terminal being connected to a ground potential;
   a second two-terminal-pair surface acoustic wave resonator having third and fourth input terminals and third and fourth output terminals, said fourth input terminal and said third output terminal being connected to said ground potential;
   a fifth input terminal connected to said second input terminal in said first two-terminal-pair surface acoustic wave resonator and said third input terminal in said second two-terminal-pair surface acoustic wave resonator, to which an unbalanced signal is inputted;

a fifth output terminal connected to said first output terminal of said first surface acoustic wave resonator, from which a first balanced signal having a phase opposite from that of said unbalanced signal is outputted; and a sixth output terminal connected to said fourth output terminal of said second surface acoustic wave resonator, from which a second balanced signal having a phase opposite from that of said unbalanced signal is outputted, said second output terminal in said first two-terminal-pair surface acoustic wave resonator being connected to said third output terminal in said second two-terminal-pair surface acoustic wave resonator.

2. The differential surface acoustic wave filter according to claim 1, wherein said first input terminal and said second output terminal in said first two-terminal-pair surface acoustic wave resonator and said fourth input terminal and said third output terminal in said second two-terminal-pair surface acoustic wave resonator are connected to a ground potential.

3. The differential surface acoustic wave filter according to claim 1, wherein said first or second two-terminal-pair surface acoustic wave resonator has first and second interdigital transducers and said first interdigital transducer is formed so as to be opposed to said second interdigital transducer.

4. The differential surface acoustic wave filter according to claim 1, wherein said first or second two-terminal-pair surface acoustic wave resonator has first, second and third interdigital transducers and said second interdigital transducer is formed so as to be opposed to said first and third interdigital transducers.

5. The differential surface acoustic wave filter according to claim 4, wherein said second interdigital transducer is disposed between said first and third interdigital transducers, one interdigital electrode in said second interdigital transducer being connected to said second or third input terminals of said first or second two-terminal-pair surface acoustic wave resonator, the other interdigital electrode in said second interdigital transducer being connected to a ground potential, one interdigital transducer in each of said first and third interdigital transducer being connected to said second or fourth output terminal of said first or second two-terminal-pair surface acoustic wave resonator.

6. The differential surface acoustic wave filter according to claim 1, wherein said first and second two-terminal-pair surface acoustic wave resonator output signals having a phase which is substantially 180° different from that of said unbalanced signal.

7. The differential surface acoustic wave filter according to claim 1, wherein said first and second two-terminal-pair surface acoustic wave resonators are substantially identical internally.

8. The differential surface acoustic wave filter according to claim 1, wherein said first through fourth two-terminal-pair surface acoustic wave resonators are substantially identical internally.

9. A differential surface acoustic wave filter comprising:

a first two-terminal-pair surface acoustic wave resonator having first and second input terminals and first and second output terminals, said first input terminal and said second output terminal being connected to a ground potential;

a second two-terminal-pair surface acoustic wave resonator having third and fourth input terminals and third and fourth output terminals, said fourth input terminal and said third output terminal being connected to said ground potential;

a third two-terminal-pair surface acoustic wave resonator having fifth and sixth input terminals and fifth and sixth output terminals, said fifth input terminal being connected to said first output terminal, said sixth input terminal being connected to said second output terminal;

a fourth two-terminal-pair surface acoustic wave resonator having seventh and eighth input terminals and seventh and eighth output terminals, said seventh input terminal being connected to said third output terminal, said eighth input terminal being connected to said fourth output terminal;

a ninth input terminal connected to said second input terminal in said first two-terminal-pair surface acoustic wave resonator and said third input terminal in said second two-terminal-pair surface acoustic wave resonator, to which an unbalanced signal is inputted;

a ninth output terminal connected to said fifth output terminal of said third surface acoustic wave resonator, from which a first balanced signal having a phase substantially the same as that of said unbalanced signal is outputted; and a tenth output terminal connected to said eighth output terminal in said fourth two-terminal-pair surface acoustic wave resonator, from which a second unbalanced signal having a phase substantially the same as that of said unbalanced signal is outputted, said sixth output terminal in said third two-terminal-pair surface acoustic wave resonator being connected to said seventh output terminal in said fourth two-terminal-pair surface acoustic wave resonator.

10. The differential surface acoustic wave filter according to claim 9, wherein said first or second two-terminal-pair surface acoustic wave resonator has first, second and third interdigital transducers, said second interdigital transducer being formed so as to be opposed to said third interdigital transducer.

11. The differential surface acoustic wave filter according to claim 9, wherein said first and second two-terminal-pair surface acoustic wave resonators have a phase substantially 180° different from that of said unbalanced signal, and third and fourth two-terminal-pair surface acoustic wave resonators have a phase substantially the same as that of said unbalanced signal.

12. The differential surface acoustic wave filter according to claim 9, wherein said second and third-output terminals, said sixth and seventh input terminals and said sixth and seventh output terminals are connected to said ground potential.

13. The differential surface acoustic wave filter according to claim 9, wherein each of said first to fourth two-terminal-pair surface acoustic wave resonators has first and second interdigital transducers, said first interdigital transducer being formed so as to be opposed to said second interdigital transducer.

* * * * *